(12) United States Patent
Chiu

(10) Patent No.: US 12,111,233 B2
(45) Date of Patent: *Oct. 8, 2024

(54) SYSTEM AND METHOD FOR MONITORING VACUUM VALVE CLOSING CONDITION IN VACUUM PROCESSING SYSTEM

(71) Applicant: Taiwan Semiconductor Manufacturing Co., Ltd., Hsin-Chu (TW)

(72) Inventor: Pei Cheng Chiu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 140 days.

This patent is subject to a terminal disclaimer.

(21) Appl. No.: 17/881,307

(22) Filed: Aug. 4, 2022

(65) Prior Publication Data

US 2022/0373426 A1    Nov. 24, 2022

Related U.S. Application Data

(63) Continuation of application No. 16/521,989, filed on Jul. 25, 2019, now Pat. No. 11,435,257.

(Continued)

(51) Int. Cl.
*G01M 3/28* (2006.01)
*G01M 3/02* (2006.01)
(Continued)

(52) U.S. Cl.
CPC ........... *G01M 3/2876* (2013.01); *G01M 3/02* (2013.01); *G01M 13/00* (2013.01);
(Continued)

(58) Field of Classification Search
CPC ............. G01M 3/2876; F16K 37/0041; F16K 37/0083
See application file for complete search history.

(56) References Cited

U.S. PATENT DOCUMENTS 2,360,872 A * 10/1944 Hillier .................. H01J 37/224
250/311
8,752,566 B2    6/2014 Corradi
(Continued)

FOREIGN PATENT DOCUMENTS

CN    101675279 A    3/2010
CN    202497491 U    10/2012
(Continued)

OTHER PUBLICATIONS

JP-2017523809-A (Year: 2017).*
(Continued)

*Primary Examiner* — Kristina M Deherrera
*Assistant Examiner* — Fatemeh Esfandiari Nia
(74) *Attorney, Agent, or Firm* — Duane Morris LLP

(57) ABSTRACT

A system and method for cleaning and inspecting ring frames is disclosed here. In one embodiment, a vacuum valve comprising at least one sealing O-ring; and a pressure monitoring tape on a mating surface on a vacuum processing chamber, wherein the pressure monitoring tape is configured to perform a pressure profile mapping between the mating surface on the vacuum processing chamber and a surface of the at least one sealing O-ring on the vacuum valve to determine a closing condition of the vacuum valve.

20 Claims, 5 Drawing Sheets

Related U.S. Application Data

(60) Provisional application No. 62/711,398, filed on Jul. 27, 2018.

(51) Int. Cl.
  *G01M 13/00* (2019.01)
  *G01M 13/003* (2019.01)
  *G01M 13/005* (2019.01)
  *H01L 21/67* (2006.01)

(52) U.S. Cl.
  CPC ........ *G01M 13/003* (2019.01); *G01M 13/005* (2013.01); *H01L 21/67017* (2013.01)

(56) References Cited

U.S. PATENT DOCUMENTS

| | | | |
|---|---|---|---|
| 2005/0092079 A1* | 5/2005 | Ales | F16K 31/1221 73/270 |
| 2011/0120017 A1 | 5/2011 | Bang | |
| 2011/0122419 A1* | 5/2011 | Orthner | G01N 3/20 356/601 |
| 2012/0319857 A1 | 12/2012 | Brazier | |
| 2016/0005632 A1 | 1/2016 | Nishimura | |
| 2017/0350535 A1 | 12/2017 | Jameson | |
| 2020/0056722 A1 | 2/2020 | Eschenmoser | |

FOREIGN PATENT DOCUMENTS

| | | | | |
|---|---|---|---|---|
| CN | 108243620 B | | 7/2018 | |
| GB | 2042188 A | | 4/1983 | |
| JP | 2017523809 A | * | 8/2017 | |
| KR | 20130076153 A | | 7/2013 | |
| TW | 201945448 U | | 8/2011 | |
| TW | 203668506 U | | 6/2014 | |
| WO | WO-2018159418 A1 | * | 9/2018 | ............. H01L 21/56 |

OTHER PUBLICATIONS

WO-2018159418-A1 (Year: 2018).*
Somya, T., Kato, Y., Sekitani, T., Iba, S., Noguchi, Y., Murase, Y., Kawaguchi, H. and Sakurai, T., "Conformable, flexible, large-area networks of pressure and thermal sensors with organic transistor active matrixes," Proc. National Academy of Sciences of USA, vol. 102, No. 35, pp. 12321-12325, 2005. (Year: 2005).

* cited by examiner

SYSTEM AND METHOD FOR MONITORING VACUUM VALVE CLOSING CONDITION IN VACUUM PROCESSING SYSTEM

This application is a continuation of U.S. patent application Ser. No. 16/521,989, filed Jul. 25, 2019, now U.S. Pat. No. 11,435,257, which claims benefit of priority to U.S. Provisional Patent Application No. 62/711,398, filed Jul. 27, 2018, the entireties of each are referenced herein.

BACKGROUND

In the semiconductor integrated circuit (IC) industry, there is a continuing demand for smaller device dimensions and higher circuit packing densities. This demand has driven the semiconductor industry to develop new materials and complex processes. For example, when a feature (e.g., a gate/drain/source feature of a transistor, a horizontal interconnect line, or a vertical via, etc.) is to be formed on a wafer, the wafer typically goes through a production line which comprises multiple processing stations typically using different process tools to perform various operations such as cleaning, photolithography, dielectric deposition, dry/wet etching, and metal deposition, for example.

A "killer defect" caused by particles can occur on a semiconductor surface in one or more aforementioned malfunctioning processing stations along the production line. In a vacuum processing station, particles can be introduced to a vacuum processing chamber from one or more vacuum valves due to its misalignment with a mating surface on a vacuum chamber (e.g., leakage, friction, etc.). In general, inspection of vacuum valves is manually performed by a human to determine their closing condition (e.g., alignment and pressure). Such manual inspection of vacuum valves has a poor resolution. Further, such a "manual" inspection often interrupts an automatic production line, which also increases the possibility of wafer contamination.

Therefore, in contrast to the manual inspection, an automatic inspection of vacuum valves that can detect their closing conditions to provide critical insights into a wide variety of process characteristics (e.g., tools and conditions), without significantly interrupting the production line or affecting its throughput, has been desired by the IC industry. Despite this long felt need, no suitable systems meeting these requirements are available.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

Figure 1:
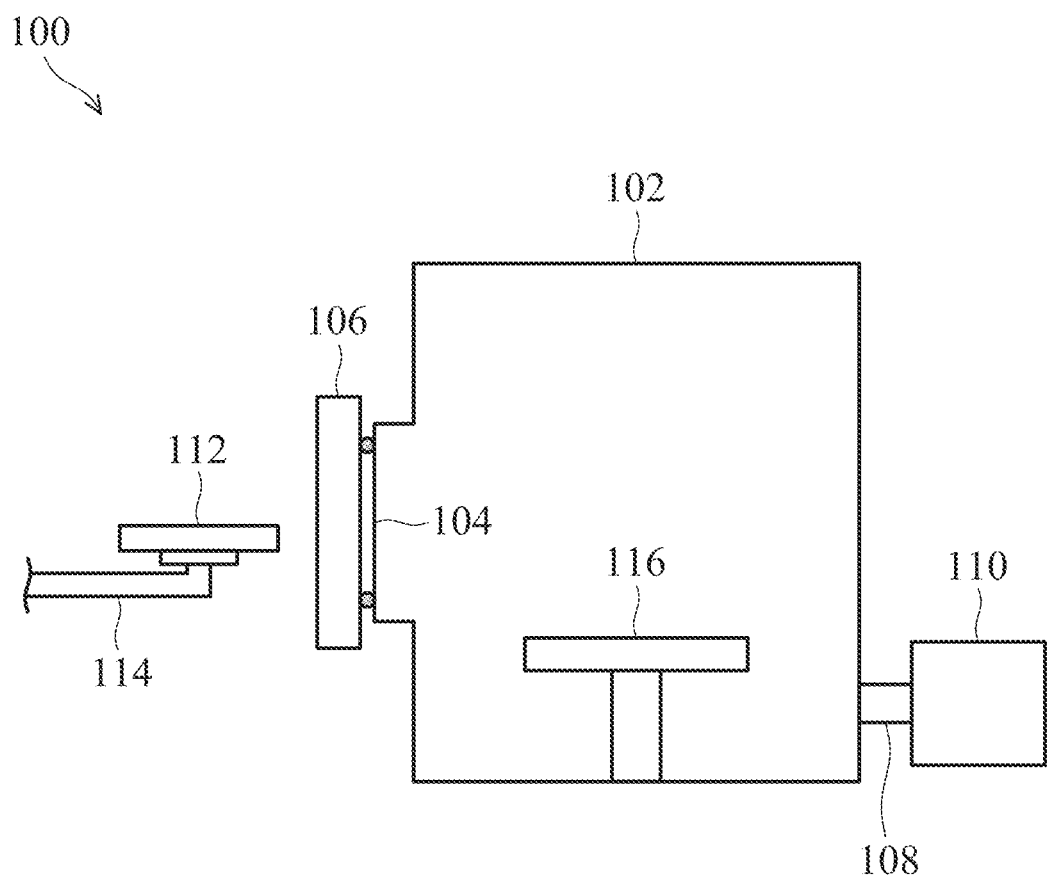
FIG. 1 illustrates a cross-sectional overview of a vacuum processing system, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The presented disclosure provides various embodiments of a method and system for monitoring a closing condition of a vacuum valve in a vacuum processing system. A vacuum valve widely used in vacuum processes needs to be inspected to prevent potential particle contamination caused by friction or leakage caused by a misalignment between the valve and the mating surface as part of a chamber wall. Traditionally, a valve and its alignment to the mating surface are inspected by a manual inspection. Such manual inspection of vacuum valves typically has a poor resolution. Further, such a "manual" inspection often interrupts an automatic production line, which also increases the possibility of wafer contamination. In contrast to the traditional manual inspection, a system and method to automatically detect the alignment of a vacuum valve and its mating surface can provide critical insights into a wide variety of process characteristics (e.g., tools and conditions) without significantly interrupting the production line or affecting its throughput has been desired by the IC industry is presented. Accordingly, the above-mentioned issues may be advantageously avoided.

This description of the exemplary embodiments is set to be understood in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIG. 1 illustrates a cross-sectional overview of a vacuum processing system 100, in accordance with some embodiments of the present disclosure. The vacuum processing system 100 comprises a vacuum processing chamber 102 which can be a physical vapor deposition (PVD) chamber or a chemical vapor deposition (CVD) chamber, according to some embodiments. In some embodiments, the physical vapor deposition chamber can be used in a DC magnetron sputtering system, a plasma enhanced sputtering system, etc. In some embodiments, the vacuum processing chamber 102 can be an atomic layer deposition (ALD) chamber. In some other embodiments, the vacuum processing chamber 102 can be used for dry etching processes, e.g., deep reactive ion etching (DRIE). In some embodiments, the vacuum processing chamber 102 can be connected to a load lock chamber (not shown) and further to the ambient environment or to another vacuum processing chamber (not shown). The vacuum processing chamber 102 comprises at least one transfer port 104 with a corresponding vacuum valve 106, at least one vacuum port 108 connected to a pressure control unit 110 (e.g., vacuum pump). In some embodiments, the vacuum processing chamber 102 can comprise at least one gas-feeding port, a temperature control unit, a power control unit, a matching circuit depending on the application and system. In some embodiments, the gas through the gas-feeding port to the processing chamber 102 may include at least one or a combination of $O_2$, Ar, $N_2$, $H_2$, $NH_3$, $N_2O$, $CF_4$, $SF_6$, $CCl_4$, $CH_4$, $H_2S$, $SiH_4$, metal-containing precursors, etc. Although not shown in the figure, for the ones with ordinary skill in the art it is understandable that the vacuum processing chamber 102 may be also equipped with a plurality of pressure gauges, thickness monitor systems (quartz crystal monitor, spectroscopic ellipsometer, reflection high-energy electron diffraction detector (RHEED)), shutters, a rotational manipulator, viewports, transfer ports, etc.

According to the exemplary embodiment described herein, the vacuum processing system 100 can be used in processing the surface layers of a semiconductor wafer 112. For example, any of a photoresist layer, mask layer, or other layer of a semiconductor wafer as desired, can be processed before or after an etch step, or any combination thereof, according to a specified recipe. The recipe also specifies parameters used to establish the proper environment in the vacuum processing chamber 102 for realizing the desired features and feature dimensions on the semiconductor wafer 112. The recipe can specify a type of reactant gas to be introduced into the vacuum processing chamber 102 and its flow rate, a pressure during reaction, a temperature and a power.

Referring to FIG. 1, the semiconductor wafer 112 that can be transferred through the transfer port 104 to the vacuum processing chamber 102 for desired processes. In some embodiments, the vacuum valve 106 comprises a mechanism to provide an opening and a closing motion to the vacuum valve. In some embodiments, the vacuum processing system 100 further comprises a wafer transfer mechanism 114 for loading the semiconductor wafer 112 to and unloading the semiconductor wafer 112 from a wafer stage 116 in the vacuum processing chamber 102. The semiconductor wafer 112 may be a bulk silicon substrate although other semiconductor materials including group III, group IV, and group V elements may also be used. Alternatively, the semiconductor wafer 102 may be a silicon-on-insulator (SOI) substrate. In some embodiments, a device layer may be a polysilicon layer (not shown) disposed on the semiconductor wafer for the formation of one or more polysilicon gates in the wafer. In another embodiment, the device layer may be a metallization layer such as an inter-layer dielectric (ILD) or an inter-metal dielectric layer (IMD) for forming interconnect structures (e.g., metal lines and/or vias). In yet other embodiments, the device layer may be any layer in the semiconductor wafer 112 that may be patterned using photolithography and etching processes. The wafer may include numerous device layers. Furthermore, the device layer may include a buffer layer (e.g., an oxide interfacial layer, not shown), an etch stop layer (e.g., a silicon nitride layer, a silicon carbide layer, or the like), or the like. A hard mask may be formed over the device layer for use as a patterning mask. The hard mask may comprise an oxide, silicon oxynitride (SiON), silicon nitride ($Si_3N_4$), titanium nitride (TiN), or the like.

Figure 2A:
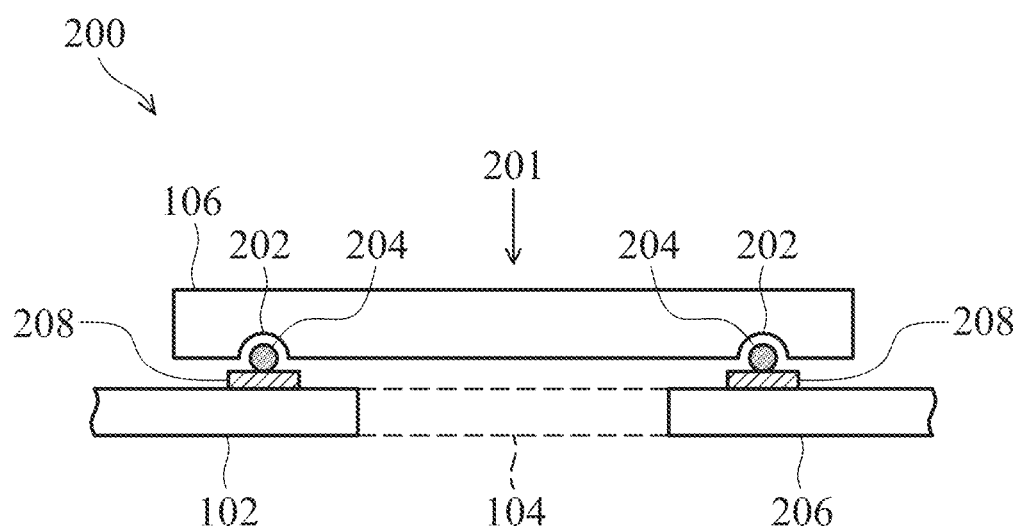
FIG. 2A illustrates a cross-sectional view of a pressure monitoring tape for monitoring a closing condition of a vacuum valve with an o-ring on a bottom surface for sealing with a mating surface on a vacuum processing chamber, in accordance with some embodiments of the present disclosure.

FIG. 2A illustrates a cross-sectional view of a pressure monitoring tape 208 for monitoring a closing condition of a vacuum valve 106 with an o-ring 204 on a bottom surface for sealing with a mating surface 206 on a vacuum processing chamber 102, in accordance with some embodiments of the present disclosure. In some embodiments, the vacuum valve 106 is a transfer valve, a transfer door, a gate valve, a pendulum valve, etc. with a single-axis or a multi-axis closing mechanism. In some embodiment, the axis 201 along which the vacuum valve 106 closes is perpendicular to the transfer port 104. In some embodiments, the transfer port 104 for transferring semiconductor wafers 112 can be in different shapes, for example, rectangular triangular, and hexagonal according to the process configurations. In some embodiments, the vacuum valve 106 can be made of stainless steel. In some embodiments, the vacuum valve 106 can be made of aluminum for magnetic sensitive processes.

Different type of seals can be used between the vacuum valve 106 and a pressure sensing tape 208 on the mating surface 206 on the vacuum processing chamber 102, e.g., on a flange, depending on the pressure range and application. O-rings are the most frequently used of all seals. In the illustrated embodiments, an o-ring 204 can be made of elastomers with different hardness. In some embodiments, the hardness of the o-ring 204 is selected so that the o-ring 204 can adapt to the unevenness of the mating surfaces 206 to ensure a seamless contact. The surface of the o-ring 204 is free of releasing grease, smooth and crack/scratch-free. In some embodiments, the o-ring 204 is coated with a thin film of a low vapor pressure grease (e.g., silicon grease, mineral oil based or perfluoropolyether-based grease), which is used to smooth out small irregularities on the surface of the o-ring 204 and the pressure sensing tape 208 on the mating surface 206. In some embodiments, the cord diameter of the o-ring 204 is in a range of 2-12 millimeter (mm), which is selected to ensure that the o-ring 204 provides a proper sealing effect and is not excessively compressed. In some embodiments, the o-ring 204 is placed in axial or a radial grooves 202 depending on the closing motion of the valve relative to the mating surface. In some embodiments, the o-ring groove 202 is larger than the diameter of the o-ring 204 to ensure a secured assembly. In some embodiments, a plurality of o-rings 204 in o-ring grooves 202 can be configured on the vacuum valve 106.

In some embodiments, at a closed state of the vacuum valve 106, the o-ring 204 is aligned with the pressure monitoring tape 208 so that the pressure monitoring tape 208 can measure the pressure between the o-ring 104 and the mating surface 206 to evaluate the alignment and the pressure of the vacuum valve 106. In some embodiments, the pressure monitoring tape 208 comprises a plurality of sensing elements configured as an array. In some embodiments, each of the plurality of sensing elements comprises thin film sensors with a thickness of 10 microns to several hundreds of microns. In some embodiments, the back of the pressure monitoring tape 208 comprises adhesives that allow a facile integration to the mating surface 206 on the vacuum processing chamber 102. In some embodiments, the adhesive is vacuum grade and has low vapor pressure to avoid degassing into the vacuum system. In some embodiments, the pressure monitoring tape 208 is flexible. In some embodiments, the sensing element 308 in the pressure monitoring tape 208 can detect the contact and measure the surface contact pressure between the surface of the o-ring 204 and the mating surface 206 once properly calibrated. The sensing element is a tactile force sensor which can be based on different technologies and materials, for example, capacitive, piezoresistive, which will be discussed further in detail below in FIG. 4.

Figure 2B:
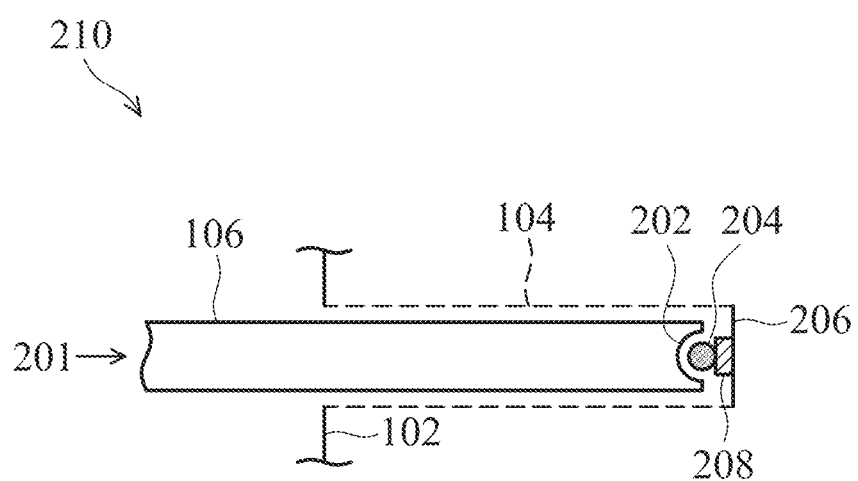
FIG. 2B illustrates a cross-sectional view of a pressure monitoring tape for monitoring a closing condition of a vacuum valve with an o-ring on a side surface for sealing with a mating surface on a vacuum processing chamber, in accordance with some embodiments of the present disclosure.

FIG. 2B illustrates a cross-sectional view of a pressure monitoring tape 208 for monitoring a closing condition of a vacuum valve 106 with an o-ring 204 on a side surface for sealing with a mating surface 206 on a vacuum processing chamber 102, in accordance with some embodiments of the present disclosure. In some embodiments, the closing motion of the vacuum valve 106 (e.g., single axis gate valve or a pendulum valve) can be along an axis 201 that is not perpendicular to the transfer port 104. The o-ring 204 in the o-ring groove 202 can be on the edge surface of the vacuum valve 106 to make a proper seal with the mating surface 206. The pressure monitoring tape 208 is configured on the mating surface 206 according to the position of the o-ring 204. In the illustrated embodiment, the pressure monitoring tape 208 is placed on the inner surface of a flange attached to the transfer port 104.

Figure 3:
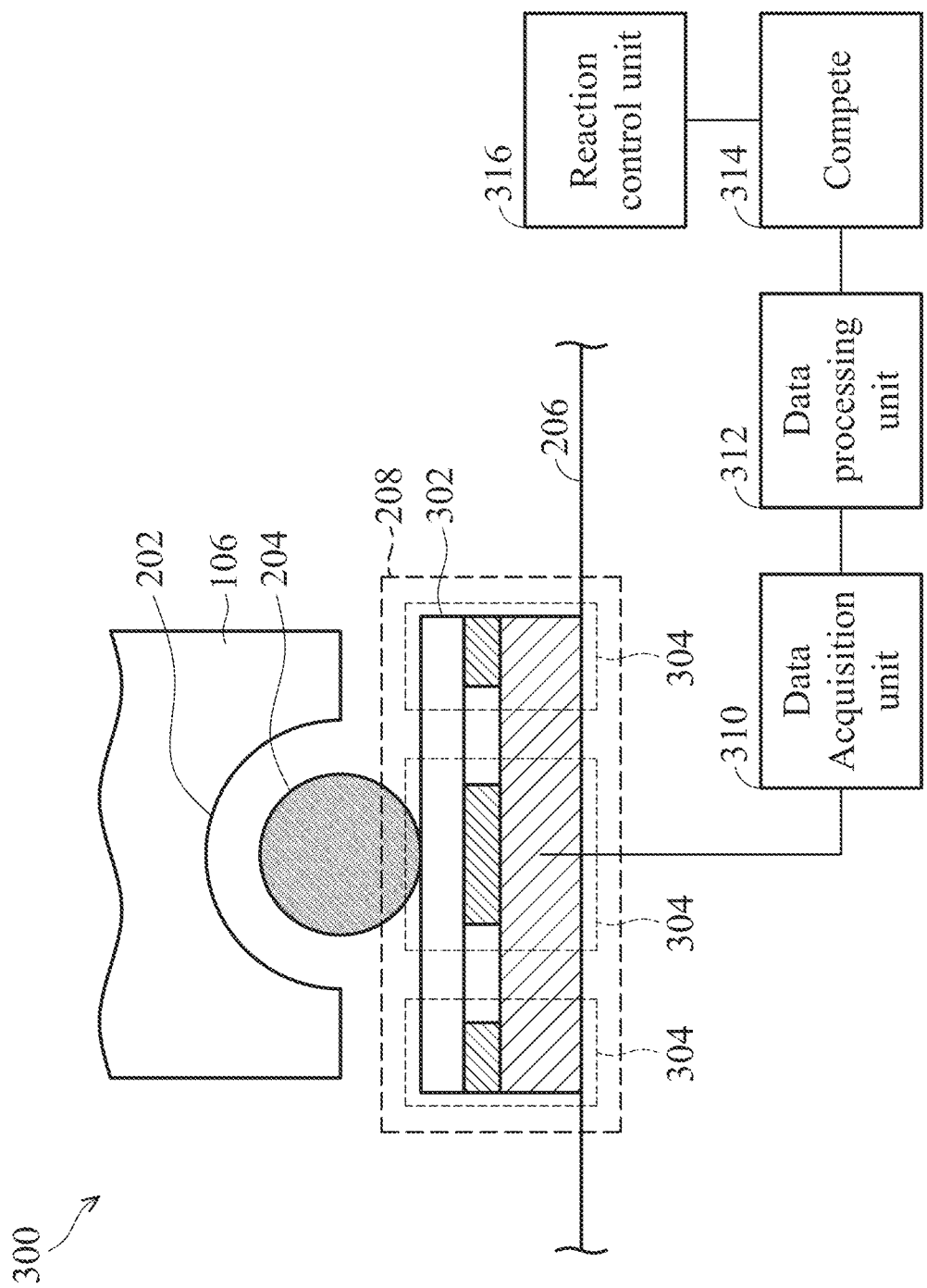
FIG. 3 illustrates a cross-sectional view of a monitoring system for monitoring the closing condition of a vacuum valve in a vacuum processing system, in accordance with some embodiments of the present disclosure.

FIG. 3 illustrates a cross-sectional view of a monitoring system 300 for monitoring the closing condition of a vacuum valve 106 in a vacuum processing system 100, in accordance with some embodiments of the present disclosure. The pressure monitoring system 300 comprises a pressure monitoring tape 208 on a mating surface 206, a data acquisition unit 310, a data processing unit 312, a local computer 314 and a deposition control unit 316, according to the illustrated embodiment.

The pressure monitoring tape 208 comprises an array of sensing elements 304. In some embodiments the sensing element 304 is a tactile sensor based on various technologies. In some embodiments, the sensing element 304 can be a capacitive tactile sensor with two parallel plates, in which the applied force can change the charge stored in the capacitor by changing the distance between the two parallel plates. In some embodiments, the sensing element 304 can be a piezoelectric tactile sensor, in which an electrical potential is formed according to the applied stress or strain. In some embodiments, the sensing element 304 can be a piezoresistive tactile sensor, in which the resistivity change according to the applied stress or strain. In some embodiments, the sensing element 304 can be fabricated using a CMOS (complementary metal-oxide-semiconductor) technology on semiconductors. Although three are 3 sensing elements in one row shown in the illustrated embodiment, it should be noted that any number of sensing elements in a row and any number of columns/rows in an array can be used and are within the scope of this disclosure. The array of sensing elements is configured according to the size/number of the sensing elements 304 and requirement of the spatial resolution.

The array of sensing element 304 in the pressure monitoring tape 208 can be coated with a protective coating 302. Proper calibration is required to compensate a constant drift of change of properties (e.g., capacitance, resistance, etc.) under a constant pressure for a prolonged duration of time. In some embodiments, the sensing element 304 is a flexible film pressure sensor or an electronic skin. In some embodiments, the sensing element is protected by a flexible thin film or a Teflon coating.

The array of sensing element 304 is then connected to a data acquisition unit 310, according to some embodiments. The data acquisition unit 310 comprises a scanning circuit, an address generator, a decoder, etc., which allows a readout from each sensing element 304 in the array. The scan speed across the entire array can be a few tens of kilohertz and can be configured by users according to the number of sensing elements and their response time. The data acquisition unit 310 is further connected to a data processing unit 312 and a local computer 314, where the measurement data can be processed by an analog-to-digital (A/D) converter, displayed and stored on a local computer.

The data can be displayed in real-time on the screen of the local computer 314 to monitor the closing process of the vacuum chamber, the status of the vacuum valve 106, the contacting area between surfaces in order to convert measured force to pressure. Furthermore, the system presented here can also provide opportunities to monitor the lifetime of the o-ring 204 for early detection of failure in o-ring 204 to prevent leakage or contamination to the vacuum processing system 100.

In addition to the pressure distribution, the local computer 314 can be further configured to obtain an average pressure value, a maximum pressure value, a minimum pressure value and a deviation of pressure values. In some embodiments, these values can be compared to predefined or user-preconfigured threshold values in order to determine whether a process in the vacuum processing chamber 102 can be performed. If a value is within a predefined or user-preconfigured threshold value, the local computer 314 can further instruct the vacuum processing control unit 316 to perform the vacuum processing. If a value is out of a predefined or user-preconfigures threshold value, the local computer 314 can further alarm the operator and trigger a preconfigured maintenance procedure.

The control unit 316 is a representative device and may comprise a processor, a memory, an input/output interface, a communications interface, and a system bus. The processor may comprise any processing circuitry operative to control the operations and performance of the control unit 316 of the system 100. In various aspects, the processor may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor also may be implemented by a controller, a microcontroller, an application specific integrated circuit (ASIC), a field programmable gate array (FPGA), a programmable logic device (PLD), and so forth.

In various aspects, the processor may be arranged to run an operating system (OS) and various applications. Examples of an OS comprise, for example, operating systems generally known under the trade name of Apple OS, Microsoft Windows OS, Android OS, and any other proprietary or open source OS. Examples of applications comprise, for example, a telephone application, a camera (e.g., digital camera, video camera) application, a browser application, a multimedia player application, a gaming application, a messaging application (e.g., email, short message, multimedia), a viewer application, and so forth.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in the memory.

In some embodiments, the memory may comprise any machine-readable or computer-readable media capable of storing data, including both volatile/non-volatile memory and removable/non-removable memory. The memory may comprise at least one non-volatile memory unit. The non-volatile memory unit is capable of storing one or more software programs. The software programs may contain, for example, applications, user data, device data, and/or configuration data, or combinations therefore, to name only a few. The software programs may contain instructions executable by the various components of the control circuits 112 of the system 100.

For example, memory may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory may contain an instruction set, in the form of a file for executing a method of generating one or more timing libraries as described herein. The instruction set may be stored in any acceptable form of machine-readable instructions, including source code or various appropriate programming languages. Some examples of programming languages that may be used to store the instruction set comprise, but are not limited to: Java, C, C++, C#, Python, Objective-C, Visual Basic, or .NET programming. In some embodiments a compiler or interpreter is comprised to convert the instruction set into machine executable code for execution by the processor.

In some embodiments, the I/O interface may comprise any suitable mechanism or component to at least enable a user to provide input to the control unit 316 of the system 300 and the control unit 316 to provide output to the user. For example, the I/O interface may comprise any suitable input mechanism, including but not limited to, a button, keypad, keyboard, click wheel, touch screen, or motion sensor. In some embodiments, the I/O interface may comprise a capacitive sensing mechanism, or a multi-touch capacitive sensing mechanism (e.g., a touchscreen).

In some embodiments, the I/O interface may comprise a visual peripheral output device for providing a display visible to the user. For example, the visual peripheral output device may comprise a screen such as, for example, a Liquid Crystal Display (LCD) screen, incorporated into the control unit 316 of the system 300. As another example, the visual peripheral output device may comprise a movable display or projecting system for providing a display of content on a surface remote from the control unit 316 of the vacuum processing system 100. In some embodiments, the visual peripheral output device can comprise a coder/decoder, also known as a Codec, to convert digital media data into analog signals. For example, the visual peripheral output device may comprise video Codecs, audio Codecs, or any other suitable type of Codec.

The visual peripheral output device also may comprise display drivers, circuitry for driving display drivers, or both. The visual peripheral output device may be operative to display content under the direction of the processor. For example, the visual peripheral output device may be able to play media playback information, application screens for applications implemented on the control unit 316 of the system 300, information regarding ongoing communications operations, information regarding incoming communications requests, or device operation screens, to name only a few.

In some embodiments, the communications interface may comprise any suitable hardware, software, or combination of hardware and software that is capable of coupling the control unit 316 of the system 300 to one or more networks and/or additional devices. The communications interface may be arranged to operate with any suitable technique for controlling information signals using a desired set of communications protocols, services or operating procedures. The communications interface may comprise the appropriate physical connectors to connect with a corresponding communications medium, whether wired or wireless.

Systems and methods of communication comprise a network, in accordance with some embodiments. In various aspects, the network may comprise local area networks (LAN) as well as wide area networks (WAN) including without limitation Internet, wired channels, wireless channels, communication devices including telephones, computers, wire, radio, optical or other electromagnetic channels, and combinations thereof, including other devices and/or components capable of/associated with communicating data. For example, the communication environments comprise in-body communications, various devices, and various modes of communications such as wireless communications, wired communications, and combinations of the same.

Wireless communication modes comprise any mode of communication between points (e.g., nodes) that utilize, at least in part, wireless technology including various protocols and combinations of protocols associated with wireless transmission, data, and devices. The points comprise, for example, wireless devices such as wireless headsets, audio and multimedia devices and equipment, such as audio players and multimedia players, telephones, including mobile telephones and cordless telephones, and computers and computer-related devices and components, such as printers, network-connected machinery, and/or any other suitable device or third-party device.

Wired communication modes comprise any mode of communication between points that utilize wired technology including various protocols and combinations of protocols associated with wired transmission, data, and devices. The points comprise, for example, devices such as audio and multimedia devices and equipment, such as audio players and multimedia players, telephones, including mobile telephones and cordless telephones, and computers and computer-related devices and components, such as printers, network-connected machinery, and/or any other suitable device or third-party device. In various implementations, the wired communication modules may communicate in accordance with a number of wired protocols. Examples of wired protocols may comprise Universal Serial Bus (USB) communication, RS-232, RS-422, RS-423, RS-485 serial protocols, FireWire, Ethernet, Fiber Channel, MIDI, ATA, Serial ATA, PCI Express, T-1 (and variants), Industry Standard Architecture (ISA) parallel communication, Small Computer System Interface (SCSI) communication, or Peripheral Component Interconnect (PCI) communication, to name only a few examples.

Accordingly, in various aspects, the communications interface may comprise one or more interfaces such as, for example, a wireless communications interface, a wired communications interface, a network interface, a transmit interface, a receive interface, a media interface, a system interface, a component interface, a switching interface, a chip interface, a controller, and so forth. When implemented by a wireless device or within wireless system, for example, the communications interface may comprise a wireless interface comprising one or more antennas, transmitters, receivers, transceivers, amplifiers, filters, control logic, and so forth.

In various embodiments, the communications interface may provide voice and/or data communications functionality in accordance a number of wireless protocols. Examples of wireless protocols may comprise various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may comprise various wireless wide area network (WWAN) protocols, such as GSM cellular radiotelephone system protocols with GPRS, CDMA cellular radiotelephone communication systems with 1xRTT, EDGE systems, EV-DO systems, EV-DV systems, HSDPA systems, and so forth. Further examples of wireless protocols may comprise wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may comprise near-field communication techniques and protocols, such as electromagnetic induction (EMI) techniques. An example of EMI techniques may comprise passive or active radio-frequency identification (RFID) protocols and devices. Other suitable protocols may comprise Ultra Wide Band (UWB), Digital Office (DO), Digital Home, Trusted Platform Module (TPM), ZigBee, and so forth.

In some embodiments, the control unit 316 of the system 300 may comprise a system bus that couples various system components including the processor, the memory, and the I/O interface. The system bus can be any of several types of bus structure(s) including a memory bus or memory controller, a peripheral bus or external bus, and/or a local bus using any variety of available bus architectures including, but not limited to, 9-bit bus, Industrial Standard Architecture (ISA), Micro-Channel Architecture (MCA), Extended ISA (EISA), Intelligent Drive Electronics (IDE), VESA Local Bus (VLB), Personal Computer Memory Card International Association (PCMCIA) Bus, Small Computer System Interface (SCSI) or other proprietary bus, or any custom bus suitable for computing device applications.

Figure 4:
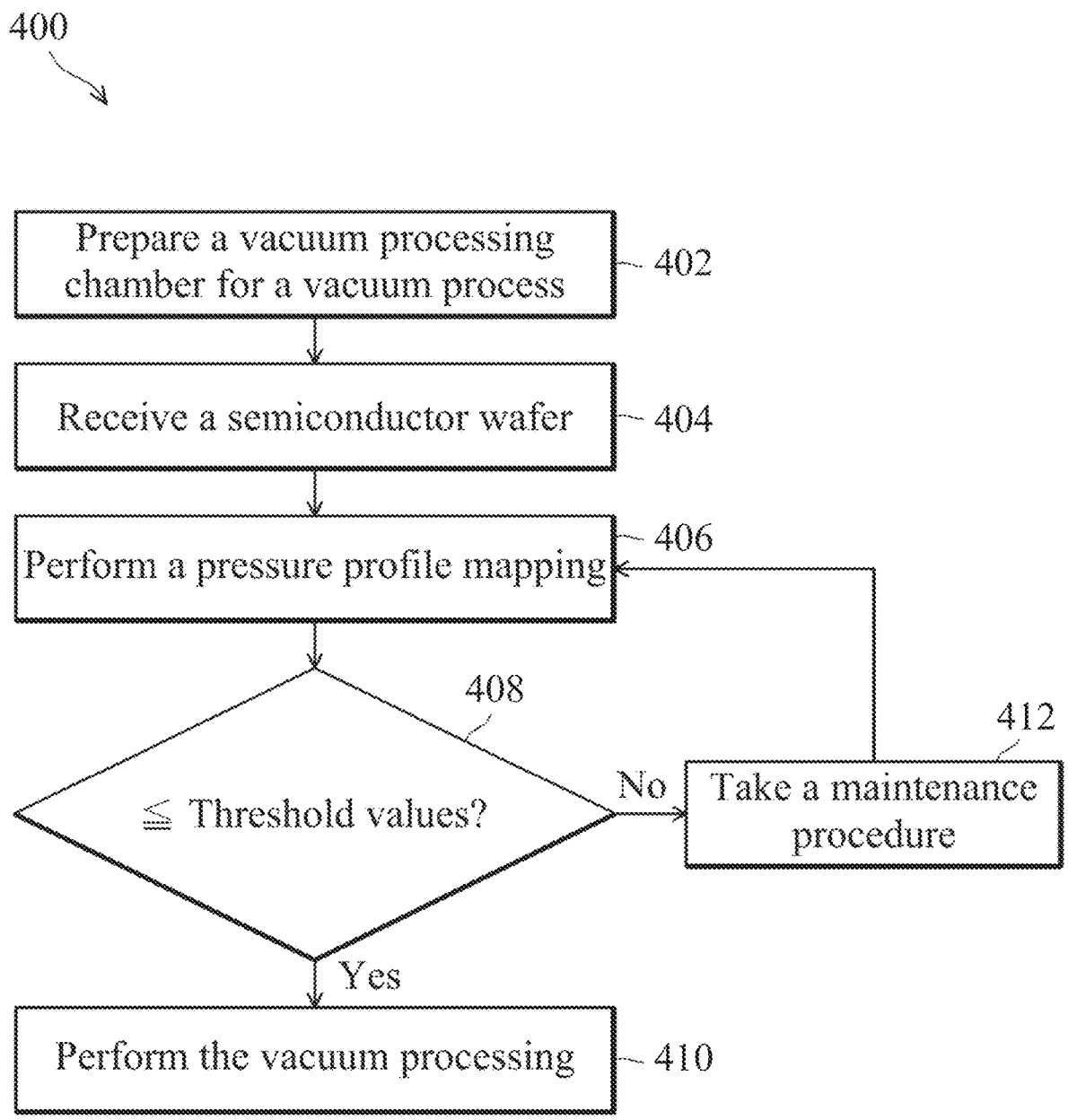
FIG. 4 illustrates a flowchart of a method to use a pressure monitoring sensing tape in a vacuum processing system to monitor the closing condition of a vacuum valve in a vacuum processing chamber, in accordance with some embodiments of the present disclosure.

FIG. 4 illustrates a flowchart of a method 400 to use a pressure monitoring sensing tape 208 in a vacuum processing system 100 to monitor the closing condition of a vacuum valve 106 in a vacuum processing chamber 102, in accordance with some embodiments of the present disclosure. It is understood that additional operations may be provided before, during, and after the method 400 of FIG. 4, and that some other operations may be omitted or only briefly described herein.

The method 400 starts with operation 402 in which a vacuum processing chamber 102 is prepared for a vacuum process, according to some embodiments. This preparation includes, but not limited to, cleaning the vacuum processing chamber 102 using in-situ dry etching, configuring a pressure in the vacuum processing chamber 102 using a pressure control unit 110, configuring a temperature on a stage 116, configuring an environment in the vacuum processing chamber 102 by providing at least one gas to the vacuum processing chamber 102, and configuring a reaction recipe using a reaction control unit 316, in accordance with some embodiments.

The method 400 continues with operation 404, in which the vacuum processing chamber 102 receives a semiconductor wafer 112 through a transfer port 104 for processing, according to some embodiments. In some embodiments, a vacuum valve 106 is open so that a wafer transfer mechanism 114 delivers the semiconductor wafer 112 from a load lock chamber or another processing chamber to the vacuum processing chamber 102. The semiconductor wafer 112 is delivered to and secured on the wafer stage 116. The wafer transfer mechanism 114 retracts from the vacuum processing chamber 102 and the vacuum valve 106 closes to make a seal with a mating surface 206 on the vacuum processing chamber 102 through a pressure monitoring tape 208, in some embodiments.

The method 400 continues with operation 406, in which a pressure profile mapping is performed using a pressure monitoring tape 208, according to some embodiments. The pressure monitoring tape 208 comprises a plurality of sensing elements 304. The pressure profile between a surface of an o-ring 204 and a top surface of the pressure monitoring tap is measured. Depending on the sensing technology of the sensing elements 304, a stress or a strain applied on the sensing elements creates a measurable electrical signal that can be collected by a data acquisition unit 310. A pressure value from each of the sensing elements 304 can be obtained from the electrical signal with proper calibration, e.g., contact area, by a data processing unit 312 to create a pressure profile mapping, in some embodiments. A 2-dimensional or a 3-dimensional pressure profile, i.e., pressure value versus position, can be then displayed on a screen attached to a local computer 314.

The method 400 continues with operation 408, in which pressure data is compared to a predefined or user-preconfigured threshold values to determine the closing status of the vacuum valve 106, according to some embodiments. The local computer 314 is further configured to analyze the pressure profile mapping to obtain values such as an average pressure value, a maximum pressure value, a minimum pressure value, a standard deviation value, etc. These values are then compared to predetermined threshold values to determine the alignment between the vacuum valve 106 and the mating surface 206 and the closing condition of the vacuum valve 106. If the measured values are within the predetermined threshold values, the local computer 314 instructs the reaction control unit to continue with operation 510 in which the vacuum processing is performed on the semiconductor wafer 112. If the measured values are out of the predetermined threshold values, the method continues with operation 512 in which the local computer 314 triggers a maintenance procedure using the reaction control unit 316, for example examining the closing mechanism on the vacuum valve 106, cleaning or replacing the o-ring 204, etc. After the maintenance procedure is performed, the pressure profile mapping is measured again through operation 506 and the vacuum processing is further performed on the semiconductor wafer 112 when the measured values are within the predetermined threshold values, in some embodiments.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the inventive concepts, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is set to be understood in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

In an embodiment, a vacuum valve closing condition monitoring system, comprising: a vacuum valve comprising at least one sealing O-ring; and a pressure monitoring tape on a mating surface on a vacuum processing chamber, wherein the pressure monitoring tape is configured to perform a pressure profile mapping between the mating surface on the vacuum processing chamber and a surface of the at least one sealing O-ring on the vacuum valve to determine a closing condition of the vacuum valve.

In another embodiment, a vacuum valve closing condition monitoring method, comprising: closing a vacuum valve on a vacuum processing chamber, wherein the vacuum valve comprises at least one sealing O-ring; and determining a closing condition of the vacuum valve using a pressure monitoring tape, wherein the pressure monitoring tape is configured on a mating surface on the vacuum processing chamber to perform the pressure profile mapping between the mating surface on the vacuum processing chamber and a surface of the at least one sealing O-ring on the vacuum valve.

Yet in another embodiment, a vacuum valve closing condition monitoring system comprising: a vacuum valve comprising at least one sealing O-ring; a pressure monitoring tape configured between a mating surface on a vacuum processing chamber and a surface of the at least one sealing O-ring on the vacuum valve; a data acquisition unit configured to collect a plurality of signals from a plurality of pressure sensing elements on the pressure monitoring tape, respectively; a data processing unit configured to process the plurality of signals from the plurality of pressure sensing elements to determine a plurality of pressure values, respectively; and a local computer configured to determine the closing condition of the vacuum valve based on the plurality of pressure values.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A vacuum valve monitoring system, comprising:
a vacuum valve comprising at least one sealing O-ring; and
a pressure monitoring tape attached to a mating surface of a vacuum processing chamber, wherein the pressure monitoring tape is disposed between the at least one sealing O-ring and the mating surface and is configured to perform a pressure profile mapping between the mating surface on the vacuum processing chamber and a surface of the at least one sealing O-ring on the vacuum valve to determine a closing condition of the vacuum valve, wherein at least a portion of a surface of the at least one sealing O-ring is coated with a film of low vapor pressure grease, wherein the pressure monitoring tape comprises a plurality of pressure sensing elements.

2. The system of claim 1, wherein the vacuum valve is configured to open and close a transfer port within the vacuum processing chamber.

3. The system of claim 1, further comprising a local computer configured to determine based on the pressure profile mapping a plurality of pressure values comprising an average pressure value, a maximum pressure value, a minimum pressure value and a deviation of pressure values for the at least one sealing O-ring, wherein the local computer determines whether one or more of the plurality of pressure values are within predefined threshold values.

4. The system of claim 3, wherein the local computer is further configured to
compare the plurality of pressure values to a plurality of predetermined threshold pressure values; and
determine the closing condition of the vacuum valve.

5. The system of claim 1, wherein the pressure monitoring tape is flexible.

6. The system of claim 1, wherein each of the plurality of pressure sensing elements comprises at least one of the following: capacitive, piezoresistive, and piezoelectric tactile sensors.

7. The system of claim 1, wherein each of the plurality of pressure sensing elements comprises a thin film sensor.

8. The system of claim 1, further comprising:
a data acquisition unit to collect a respective plurality of signals from each of a respective plurality of pressure sensing elements on the pressure monitoring tape; and
a data processing unit to process the respective plurality of signals.

9. A vacuum valve monitoring method, comprising:
closing a vacuum valve on a vacuum processing chamber, wherein the vacuum valve comprises at least one sealing O-ring;
determining a closing condition of the vacuum valve using a pressure monitoring tape, wherein the pressure monitoring tape is configured on a mating surface that is disposed on a wall of the vacuum processing chamber to perform a pressure profile mapping between the mating surface that is disposed on the wall of the vacuum processing chamber and a surface of the at least one sealing O-ring on the vacuum valve, wherein the pressure monitoring tape is disposed between the at least one sealing O-ring and the mating surface, wherein at least a portion of a surface of the at least one sealing O-ring is coated with a film of low vapor pressure grease;

determining based on the pressure profile mapping a plurality of pressure values for the at least one sealing O-ring; and determining whether one or more of the plurality of pressure values are within predefined threshold values.

10. The method of claim 9, wherein the vacuum valve is configured to open and close a transfer port within the vacuum processing chamber.

11. The method of claim 9, wherein the pressure monitoring tape comprises a plurality of pressure sensing elements.

12. The method of claim 11, wherein each of the plurality of pressure sensing elements comprises at least one of the following: capacitive, piezoresistive, and piezoelectric tactile sensors.

13. The method of claim 11, wherein each of the plurality of pressure sensing elements comprises a thin film sensor.

14. The method of claim 9, wherein the determining further comprising:

collecting a respective plurality of signals from a respective plurality of pressure sensing elements on the pressure monitoring tape; and processing the respective plurality of signals from the respective plurality of pressure sensing elements to determine the pressure profile mapping.

15. A vacuum valve monitoring system comprising:

a vacuum valve comprising at least one sealing O-ring;

a pressure monitoring tape disposed between a mating surface of a vacuum processing chamber and a surface of the at least one sealing O-ring on the vacuum valve, wherein at least a portion of a surface of the at least one sealing O-ring is coated with a film of low vapor pressure grease;

a data acquisition unit configured to collect a respective plurality of signals from each of a respective plurality of pressure sensing elements on the pressure monitoring tape;

a data processing unit configured to process the respective plurality of signals from the respective plurality of pressure sensing elements; and a local computer configured to determine a closing condition of the vacuum valve based on a plurality of pressure values obtained from the plurality of signals, wherein the local computer determines whether the one or more of the plurality of pressure values are within predefined threshold values.

16. The system of claim 15, wherein the pressure monitoring tape is flexible.

17. The system of claim 15, wherein each of the plurality of pressure sensing elements comprises at least one of the following: capacitive, piezoresistive, and piezoelectric tactile sensors.

18. The system of claim 15, wherein each of the plurality of pressure sensing elements comprises a thin film sensor.

19. The system of claim 15, wherein the vacuum valve is configured to open and close a transfer port within the vacuum processing chamber.

20. The system of claim 15, wherein if the one or more of the plurality of pressure values are within the predefined threshold values, instruct the vacuum processing chamber to perform vacuum processing, and wherein if the one or more of the plurality of pressure values are not within the predefined threshold values, alarm an operator and trigger a preconfigured maintenance procedure.

* * * * *